(12) United States Patent
Wu et al.

(10) Patent No.: US 7,619,242 B2
(45) Date of Patent: Nov. 17, 2009

(54) CELLULOSES AND DEVICES THEREOF

(75) Inventors: Yiliang Wu, Mississauga (CA); Beng Ong, Mississauga (CA); Ping Liu, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 136 days.

(21) Appl. No.: 11/065,149

(22) Filed: Feb. 25, 2005

(65) Prior Publication Data

US 2006/0192199 A1 Aug. 31, 2006

(51) Int. Cl.
*H01L 51/30* (2006.01)
(52) U.S. Cl. .................. 257/40; 257/E51.007
(58) Field of Classification Search ............... 257/40, 257/E51.001–E51.052; 438/1, 99, 780–781
See application file for complete search history.

(56) References Cited

U.S. PATENT DOCUMENTS

| | | | | |
|---|---|---|---|---|
| 3,350,941 A | * | 11/1967 | Misevich et al. | 73/335.04 |
| 3,369,159 A | * | 2/1968 | Parker et al. | 257/288 |
| 4,638,346 A | * | 1/1987 | Inami et al. | 257/253 |
| 4,773,935 A | * | 9/1988 | Uda et al. | 252/408.1 |
| 5,055,360 A | * | 10/1991 | Ogura et al. | 428/473.5 |
| 6,107,117 A | | 8/2000 | Bao et al. | |
| 6,621,099 B2 | | 9/2003 | Ong et al. | |
| 6,770,904 B2 | | 8/2004 | Ong et al. | |
| 6,774,393 B2 | | 8/2004 | Murti et al. | |
| 6,777,529 B2 | | 8/2004 | Ong et al. | |
| 6,803,262 B2 | | 10/2004 | Wu et al. | |
| 7,166,859 B2 | * | 1/2007 | Hirose et al. | 257/40 |
| 2001/0015438 A1 | * | 8/2001 | Callegari et al. | 257/40 |
| 2003/0104229 A1 | * | 6/2003 | Li et al. | 428/457 |
| 2003/0160234 A1 | | 8/2003 | Ong et al. | |
| 2003/0175551 A1 | * | 9/2003 | Smith et al. | 428/690 |
| 2003/0218166 A1 | * | 11/2003 | Tsutsui | 257/40 |
| 2004/0119400 A1 | * | 6/2004 | Takahashi et al. | 313/504 |
| 2004/0157470 A1 | * | 8/2004 | Machida et al. | 438/778 |
| 2004/0186265 A1 | | 9/2004 | Liu et al. | |
| 2004/0186266 A1 | | 9/2004 | Jiang et al. | |
| 2004/0247814 A1 | * | 12/2004 | Sirringhaus et al. | 428/64.1 |
| 2005/0045876 A1 | * | 3/2005 | Fukui | 257/40 |
| 2005/0056897 A1 | * | 3/2005 | Kawasaki et al. | 257/359 |
| 2005/0104058 A1 | * | 5/2005 | Veres et al. | 257/40 |
| 2005/0277234 A1 | * | 12/2005 | Brandon | 438/151 |
| 2006/0060834 A1 | * | 3/2006 | Hirai | 257/40 |

(Continued)

FOREIGN PATENT DOCUMENTS

JP 07221367 A * 8/1995

(Continued)

OTHER PUBLICATIONS

"High dielectric constant material development." Yen, S.P.S.; Lewis, C.R.; Cygan, P.J.; Jow, T.R.; Power Sources Symposium, 1992., IEEE 35th International Jun. 22-25, 1992 pp. 381-386.*

(Continued)

*Primary Examiner*—Douglas M Menz
*Assistant Examiner*—Matthew W Such
(74) *Attorney, Agent, or Firm*—MH2 Technology Law Group LLP

(57) ABSTRACT

An electronic device including a dielectric layer including a cellulose derivative is disclosed.

15 Claims, 2 Drawing Sheets

U.S. PATENT DOCUMENTS

| | | | |
|---|---|---|---|
| 2006/0065842 A1* | 3/2006 | Okamura et al. | 250/370.09 |
| 2006/0263953 A1* | 11/2006 | Bonfiglio | 438/151 |
| 2007/0034860 A1* | 2/2007 | Nakamura | 257/40 |

FOREIGN PATENT DOCUMENTS

| | | | |
|---|---|---|---|
| WO | WO 02099892 A1 * | 12/2002 | |
| WO | WO 2004023560 A1 * | 3/2004 | |
| WO | WO 2004077098 A1 * | 9/2004 | |
| WO | WO 2004077500 A2 * | 9/2004 | |
| WO | WO 2005006461 A1 * | 1/2005 | |

OTHER PUBLICATIONS

Callister, W. D., Jr. Materials Science and Engineering: An Introduction. 3rd ED. New York: John Wiley & Sons, Inc. (1994): pp. 623-624.*

ASI Dielectric Constants Guide (http://www.asiinstr.com/technical/Dielectric%20Constants.htm).*

Shekar, B. Chandar, et al. "Organic Thin Film Transistors: Materials, Processes and Devices." Korean J. Chem. Eng. vol. 21 (2004): pp. 267-285.*

Nishida R., et al. "Novel Linear and Cross-Linked Acrylate Polymers Bearing O-Cyanoethylated (Glycosyloxy)ethyl Side Chain with High Dielectric Properties over Wide Temperature Range." Chem. Lett., vol. 30, No. 5 (2001): pp. 394-395.*

Roichman, Y. and Tessler, N. "Structures of Polymer Field-Effect Transistor: Experimental and Numberical Analyses." Appl. Phys. Lett., vol. 80, No. 1 (Jan. 7, 2002): pp. 151-153.*

Rost, H., et al. "Air-Stable All-Polymer Field-Effect Transitors with Organic Electrodes." Synth. Met., vol. 145 (2004): pp. 83-85.*

Peng, X., et al. "All-Organic Thin-Film Transistors Made of alpha-Sexithienyl Semiconducting and Various Polymeric Insulating Layers." Appl. Phys. Lett., vol. 57, No. 19 (Nov. 5, 1990): pp. 2013-2015.*

F. Garnier, et. al. *J. Am. Chem. Soc.* 1993, vol. 115, pp. 8617.

M. Halik, et al. *J. Appl. Phys.* 2003, vol. 93, pp. 2977.

J. Ficker, et. al. *J. Appl. Phys.* 2003, vol. 94, p. 2638.

R. Schroeder, et. al. *Appl. Phys. Lett.* 2003, vol. 83, pp. 3201.

J. Veres, et al. *Adv. Funct. Mater.* 2003, vol. 13, pp. 199.

L.-L. Chua, et. al. *Appl. Phys. Lett.* 2004, vol. 84, p. 3400.

* cited by examiner

CELLULOSES AND DEVICES THEREOF

STATEMENT REGARDING FEDERALLY SPONSORED RESEARCH OR DEVELOPMENT

This invention was made with United States Government support under Cooperative Agreement No. 70NANBOH3033 awarded by the National Institute of Standards and Technology (NIST). The United States Government has certain rights in the invention.

FIELD

The present disclosure relates to celluloses and electronic devices thereof.

BACKGROUND OF THE INVENTION

Thin film transistors are fundamental components in modern-age electronics, including, for example, sensors, and imaging and display devices. Thin film transistor circuits using current mainstream silicon technology are too costly, particularly for large-area device applications such as backplane switching circuits for displays like active matrix liquid crystal monitors or televisions, where high switching speeds are not essential. The high costs of silicon-based thin film transistor circuits are due to the capital-intensive silicon fabrications as well as the complex high-temperature, high-vacuum photolithographic fabrication processes under strictly controlled environments.

Because of the cost and complexity of fabricating silicon-based thin film transistor circuits using conventional photolithography processes, there has been an increased interest in plastic thin film transistors which can potentially be fabricated using solution-based patterning and deposition techniques, such as spin coating, solution casting, dip coating, stencil/screen printing, flexography, gravure, offset printing, ink jet-printing, micro-contact printing, and the like, or a combination of these processes. Such processes are generally simpler and more cost effective compared to the complex photolithographic processes used in fabricating silicon-based thin film transistor circuits for electronic devices. To enable the use of these solution-based processes in fabricating thin film transistor circuits, solution processable materials are therefore required.

Most of the current materials research and development activities for plastic thin film transistors has been devoted to semiconductor materials, particularly solution-processable organic and polymer semiconductors. Other material components, such as solution processable dielectric materials, have not been receiving much attention.

For plastic thin film transistor applications, it is desirable for all of the materials be solution processable. It is also highly advantageous to fabricate the materials on plastic substrates at a temperature of less than about 200° C., and for example less than about 150° C. The use of plastic substrates, together with flexible organic or polymer transistor components can transform the traditional thin film transistor circuits on rigid substrates into mechanically more durable and structurally flexible plastic thin film transistor circuit designs. Flexible thin film transistor circuits may be useful in fabricating mechanically robust and flexible electronic devices.

Generally, the dielectric layer which serves as the gate dielectric in a thin-film transistor should have at least one of the following properties: i) a smooth uniform layer without pinholes, ii) a high dielectric constant to enable the thin film transistor to operate at lower voltages, and iii) no adverse effects on the transistor's performance. Additionally, for flexible integrated circuits on plastic substrates, the dielectric layer should be prepared at temperatures that would not adversely affect the dimensional stability of the plastic substrates, i.e., generally less than about 200° C., for example less than about 150° C.

A wide variety of organic and polymer materials, including polyimides (F. Garnier, et. al. *J. Am. Chem. Soc.* 1993, Vol. 115, pp. 8617), poly(vinylphenol) (M. Halik, et al. *J. Appl. Phys.* 2003, Vol. 93, pp. 2977), poly(methyl methacrylate) (J. Ficker, et. al. *J. Appl. Phys.* 2003, Vol. 94, p. 2638), polyvinylalcohol (R. Schroeder, et. al. *Appl. Phys. Lett.* 2003, Vol. 83, pp. 3201), poly(perfuoroethylene-co-butenyl vinyl ether) (J. Veres, et al. *Adv. Funct. Mater.* 2003, Vol. 13, pp. 199), and benzocyclobutene (L.-L. Chua, et. al. *Appl. Phys. Lett.* 2004, Vol. 84, p. 3400), have been studied as dielectric layers. These materials, however, do not generally meet all the economic and/or functional requirements of low-cost thin film transistors. In particular, most of the organic or polymer dielectric materials generally have low dielectric constants, and thus cannot enable low-voltage electronic devices.

RELATED APPLICATIONS AND PATENTS

Illustrated in U.S. Patent Application Publication No. 2004/0186266, the disclosure of which is totally incorporated herein by reference, is a polythiophene and device thereof. The polythiophene comprises a repeating segment of the formula:

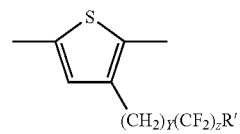

wherein R' is $CF_3$, alkoxy, or alkyl; and y and z represent the number of repeating segments.

Illustrated in U.S. Patent Application Publication No. 2004/0186265, the disclosure of which is totally incorporated herein by reference, is an electronic device containing a polythiophene prepared by a metal halide-mediated coupling polymerization in an appropriate solvent.

Illustrated in U.S. Pat. No. 6,803,262, the disclosure of which is totally incorporated herein by reference, is a process using a self-organizing polymer and a thin film transistor.

Illustrated in U.S. Pat. Nos. 6,777,529; 6,621,099; and 6,770,904; the disclosures of all of which are hereby incorporated by reference, are polythiophenes and devices thereof.

Illustrated in U.S. Pat. No. 6,774,393, the disclosure of which is hereby incorporated by reference, is a field effect transistor.

BRIEF DESCRIPTION OF THE DRAWINGS

Other aspects of the present disclosure will become apparent as the following description proceeds and upon reference to the Figures which represent illustrative embodiments.

Unless otherwise noted, the same reference numeral in different Figures refers to the same or similar feature.

SUMMARY

Figure 1:
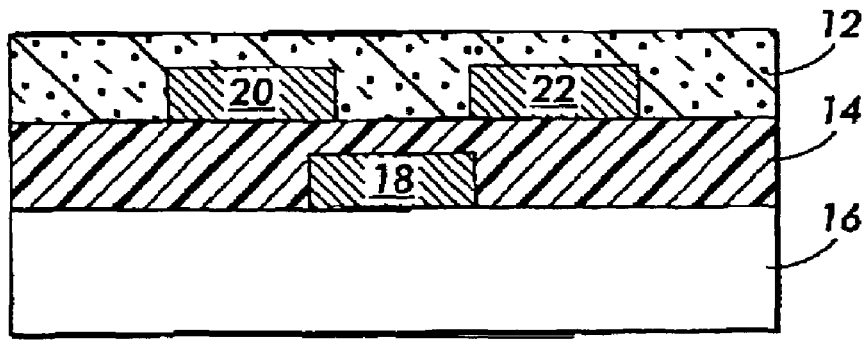
FIG. 1 represents a first embodiment of a field effect transistor.

In aspects of the invention, there are disclosed an electronic device comprising a dielectric layer comprising a cellulose derivative; a thin film transistor comprising a dielectric layer comprising a cellulose derivative.

DESCRIPTION OF VARIOUS EMBODIMENTS

Aspects of the present disclosure relate to a cellulose derivative for use in a dielectric layer for electronic devices, such as organic thin film transistors.

The cellulose derivative includes esterification or etherification derivatives of a cellulose at the free hydroxyl groups. Non-limiting examples of a cellulose derivative include cellulose acetate, cellulose acetate butyrate, cellulose acetate propionate, cellulose acetate trimellitate, and cellulose cyanoethylated. The esterification and etherification of hydroxyl groups may be varied from about 20% to 100%, for example from about 30% to about 90% by mole. The free hydroxyl groups in the cellulose derivative may offer the opportunity for crosslinking of the compound with other additives to form a crosslinked dielectric layer.

The cellulose derivatives may be solution processable, and can be used in fabricating dielectric layers via solution deposition techniques including, but not limited to, spin coating, solution casting, dip coating, stencil/screen printing, flexography, gravure, offset printing, jet-printing, micro-contact printing, a combination of these processes, and the like. Solution deposition techniques refer to any suitable solution compatible coating technique. For example, a solvent may be removed by allowing it to evaporate at a temperature ranging, for example, from about 20° C. to about 200° C. either at atmospheric pressure or under vacuum for a time of from, for example, about 10 seconds to about 24 hours.

Suitable solvents include ketones, ethers, cyclic ethers, acetals, hydrocarbons, alcohols, esters, aromatic hydrocarbons, halogenated aliphatic hydrocarbons, halogenated aromatic hydrocarbons, and polar aprotic compounds, and the like, and mixtures thereof. Non-limiting examples of suitable solvents include methylethyl ketone, dimethoxyethane, dimethoxymethane, diethyleneglycol dimethyl ether, dioxane, tetrahydrofuran, dimethyl sulfoxide, dimethyl formamide, dimethyl acetamide, N-methyl morpholine, and N-methylpyrrolidone. In an embodiment, dimethyl formamide may be used.

Suitable additives to crosslink the cellulose derivatives include, but are not limited to, compounds containing at least two isocyanate groups, compounds containing at least two epoxy groups, compounds containing at least two carboxylic acid groups, and acid anhydrides of carboxylic acid.

The dielectric layer may be any thickness suitable for use in an electronic device, such as a thin film transistor. In embodiments, the dielectric layer may have a thickness of from about 50 nanometers to about 2 micrometers, and for example from about 200 nanometers to about 1 micrometer.

The dielectric layer formed from a cellulose derivative and an optional crosslinking additive may exhibit many desirable features. For example, the dielectric layer may have at least one of the following properties: may be generally pinhole free, may have high dielectric constants, and may have high breakdown voltages. Generally, the dielectric layer prepared from the cellulose derivative may have a dielectric constant greater than about 5, for example greater than about 10, and as a further example greater than about 15. Because of the high dielectric constant of the dielectric layer, given a certain thickness, the dielectric layer may offer high capacitance larger than about 10, for example larger than about 20, as another example larger than about 30, and as a further example larger than about 40 nF/cm$^2$. The organic thin film transistors thus can be operated at low voltages with the gate bias voltage lower than about 20 V, for example lower than about 10 V, and as a further example lower than about 5 V.

In FIG. 1, there is schematically illustrated a thin film transistor ("TFT") configuration 10 comprised of a substrate 16, in contact therewith a metal contact 18 (gate electrode) and a layer of gate dielectric 14 comprising a cellulose derivative, on top of which two metal contacts, source electrode 20 and drain electrode 22, are deposited. Over and between the metal contacts 20 and 22 is an organic semiconductor layer 12.

Figure 2:
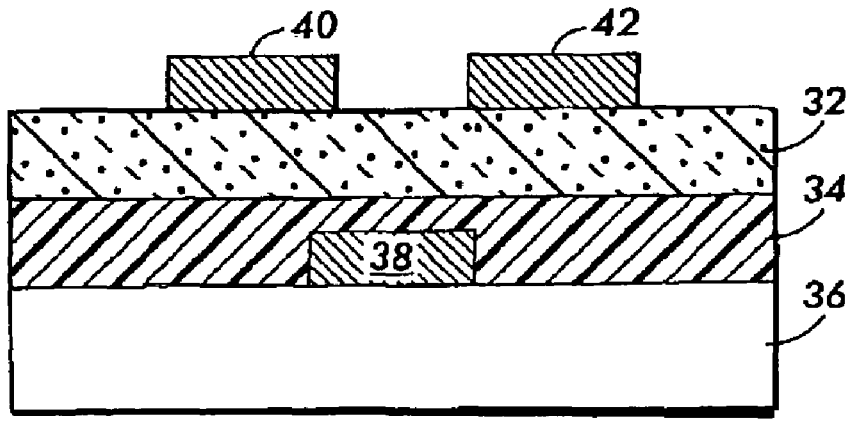
FIG. 2 represents a second embodiment of a field effect transistor.

FIG. 2 schematically illustrates another TFT configuration 30 comprised of a substrate 36, a gate electrode 38, a source electrode 40 and a drain electrode 42, a gate dielectric layer 34 comprising a cellulose derivative, and an organic semiconductor layer 32.

Figure 3:
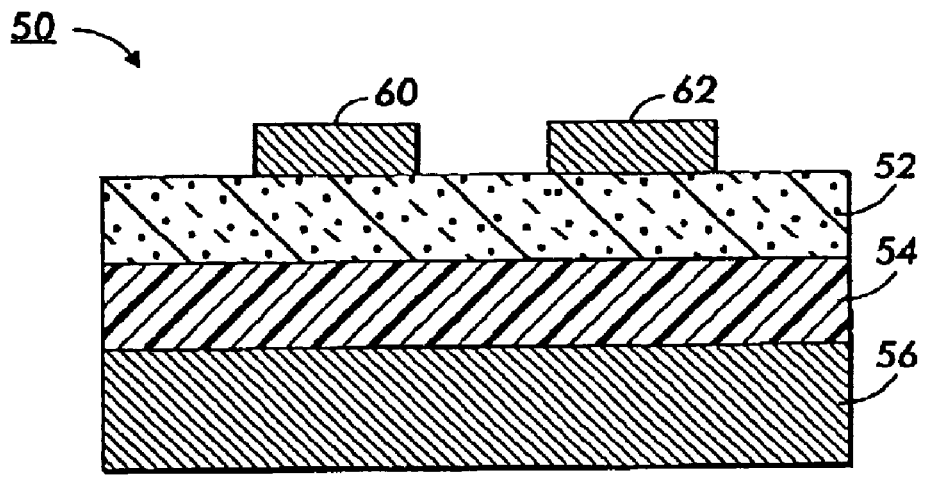
FIG. 3 represents a third embodiment of a field effect transistor.

FIG. 3 schematically illustrates a further TFT configuration 50 comprised of a heavily n-doped silicon wafer 56 which acts as both a substrate and a gate electrode, a gate dielectric layer 54 deposited on the n-doped silicon wafer, and an organic semiconductor layer 52, on top of which are deposited a source electrode 60 and a drain electrode 62.

Figure 4:
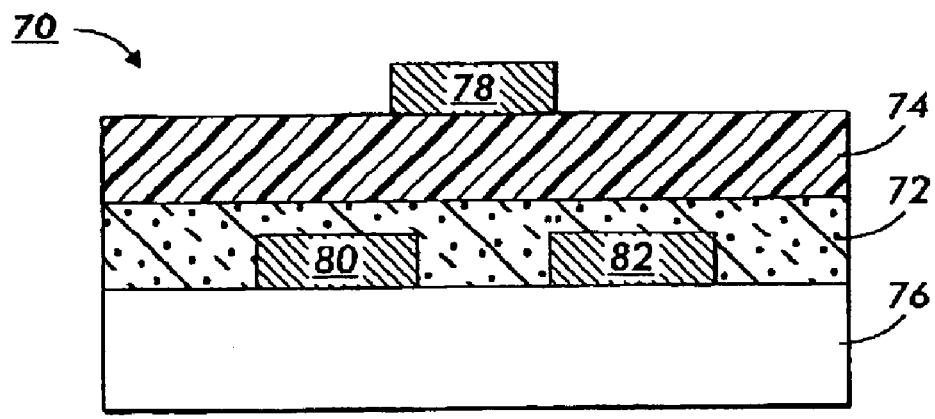
FIG. 4 represents a fourth embodiment of a field effect transistor.

FIG. 4 schematically illustrates an additional TFT configuration 70 comprised of substrate 76, a gate electrode 78, a source electrode 80, a drain electrode 82, an organic semiconductor layer 72, and a gate dielectric layer 74.

In embodiments, the present process may be used whenever there is a need to form a dielectric layer in an electronic device. The phrase "electronic device" refers to micro- and nano-electronic devices such as, for example, micro- and nano-sized transistors. Illustrative transistors include for instance field effect transistors (particularly thin film organic transistors) and bipolar transistors.

The substrate may be composed of for instance silicon, glass, or plastic. For structurally flexible devices, plastic substrate, such as for example polyester, polycarbonate, polyimide sheets and the like may be used. The thickness of the substrate may be from amount 10 micrometers to over 10 millimeters provided the required mechanical properties are satisfied for the intended applications. In embodiments, thickness of the substrate may be for example from about 50 to about 100 micrometers for a flexible plastic substrate and may be from about 1 to about 10 millimeters for a rigid substrate, such as glass or silicon.

The compositions of the gate electrode, the source electrode, and the drain electrode are now discussed. The gate electrode can be formed of a metal, a polymer, ink or paste or the substrate itself, for example heavily doped silicon. Examples of gate electrode materials include, but are not restricted to, aluminum, gold, chromium, indium tin oxide, conducting polymers such as polystyrene sulfonate-doped poly(3,4-ethylenedioxythiophene) (PSS-PEDOT), conducting ink/paste comprised of carbon black/graphite, and colloidal silver dispersion in polymer binders, such as ELECTRODAG available from Acheson Colloids Company. The gate electrode layer can be prepared by, for example, vacuum evaporation, sputtering of metals or conductive metal oxides, coating from conducting polymer solutions or conducting inks by spin coating, casting or printing. The thickness of the gate electrode layer ranges for example from about 10 to about 200 nanometers for metal films and ranges from about 1 to about 10 micrometers for polymer conductors.

The source and drain electrode layers can be fabricated from materials which provide a low resistance ohmic contact to the semiconductor layer. Typical materials suitable for use as source and drain electrodes include those of the gate electrode materials such as gold, nickel, aluminum, platinum, polymers and inks. Typical thicknesses of source and drain electrodes may be, for example, from about 40 nanometers to about 1 micrometer and, as a further example, from about 100 to about 400 nanometers.

Suitable materials for the organic semiconductor material include n-type semiconductor materials (where conductivity is controlled by negative charge carriers) and p-type semiconductor materials (where conductivity is controlled by positive charge carriers). A single material or a mixture of two, three or more different materials can be used for the semiconductor material. N-type materials include, for example, perylene pigments such as N,N'-dialkylperylene-3,4,9,10-tetracarboxylic diimides, naphthalene-1,4,5,8-tetracarboxylic diimides, certain metal phthalocyanines, nitrofluorenones, substituted fluorene malononitrile adducts, halogenated anthanthrones, tris(8-hydroxyquinolinato)aluminum and oligomers and polymers containing such groups. P-type materials include, for example, pentacene, certain metal phthalocyanines, triarylamines, carbazoles, arylhydrazones, and oligomers and polymers containing such structures, as well as polythiophenes, oligothiophenes, polyphenylvinylene, and polyvinylcarbazoles. The semiconductor polymers described in U.S. application Ser. No. 10/042,342, which is published as U.S. Patent Application No. 2003/0160234, and U.S. Pat. Nos. 6,621,099, 6,774,393, and 6,770,904, the disclosures of which are incorporated herein by reference in their entireties, may be suitable for use. Additionally, suitable materials include the semiconductor polymers disclosed in "Organic Thin Film Transistors for Large Area Electronics" by C. D. Dimitrakopoulos and P. R. L. Malenfant, Adv. Mater., Vol. 12, No. 2, pp. 99-117 (2002), the disclosure of which is also incorporated herein by reference.

Situated, for example, between and in contact with the dielectric layer and the source/drain electrodes may be the active semiconductor layer. The semiconductor layer may be formed by any suitable means including, but not limited to, vacuum evaporation, spin coating, solution casting, dip coating, stencil/screen printing, flexography, gravure, offset printing, inkjet-printing, micro-contact printing, a combination of these processes, and the like. The thickness of this layer may be from about 10 nanometers to about 1 micrometer, and for example from about 40 to about 100 nanometers.

The dielectric layer, the gate electrode, the semiconductor layer, the source electrode, and the drain electrode may be formed in any sequence as long as the gate electrode and the semiconductor layer both contact the dielectric layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of field effect transistors are described in Bao et al., U.S. Pat. No. 6,107,117, the disclosure of which is totally incorporated herein by reference.

The thin film transistor comprising a dielectric layer prepared from a cellulose derivative, may have a semiconductor channel length of for example, from about 1 micrometers to about 5 millimeters, and a channel width of from about 50 micrometers to about 10 millimeters. The semiconductor channel length may be, in embodiments from about 1 micrometer to about 1 millimeter. In other embodiments, the semiconductor channel length may be from about 1 micrometer to about 500 micrometers. In further embodiments, the channel length may be from about 5 micrometers to about 200 micrometers. The thin film transistor comprising a dielectric layer prepared from a cellulose derivative, as described herein, may have a ratio of channel width to channel length of for example from about 1 to about 10,000. In other embodiments, the ratio of channel width to channel length may be for example from about 1 to about 1,000.

The thin film transistor employing a dielectric layer prepared from a cellulose derivative in accordance with the present disclosure may exhibit satisfactory thin film transistor properties. In embodiments, the current on/off ratio of the transistors may be greater than about 1,000, and in further embodiments, greater than about 10,000. The transistor may exhibit a leakage current lower than about 1 nA, and, in embodiments, lower than about 50 pA. The transistor may also show low residual current of about $10^{-10}$ A. The transistor using dielectric layers prepared from a cellulose derivative in accordance with the present disclosure may have a mobility that may be, in embodiments, higher than about 0.001 $cm^2$/V·s, and in further embodiments may be higher than about 0.01 $cm^2$/V·s.

The source electrode may be grounded and a bias voltage of generally, for example, for a p-type semiconductor, about 0 volt to about −80 volts may be applied to the drain electrode to collect the charge carriers transported across the semiconductor channel when a voltage of generally about +10 volts to about −80 volts is applied to the gate electrode. In embodiments, a lower voltage for example from about +10 volts to about −20 volts may be applied to the gate electrode due to the high dielectric constant of the dielectric layer comprising a cellulose derivative.

EXAMPLES

The following examples are illustrative and are non-limiting to the present teachings.

Example 1

A solution of commercially available cyanoethylated cellulose (Aldrich) in DMF (5 wt. %) was filtered through a 1 micron filter, and then deposited on an n-doped silicon wafer by spin coating at a speed of 1000 rpm. This resulted in the formation of an 860 nm homogenous film after solvent evaporation. A gold electrode layer was vacuum deposited on top of the cellulose layer to enable measurement of the capacitance. The capacitance was measure to be 19 $nF/cm^2$, giving a dielectric constant of 18.5, which is 4.5 times that of silicon oxide.

Fabrication of a Thin Film Transistor

A cellulose dielectric layer was deposited as described above on an n-doped silicon wafer and dried. The conductive wafer served as the thin film transistor gate electrode. A semiconductor layer was deposited on the electroded substrate using the polythiophene semiconductor of the following formula:

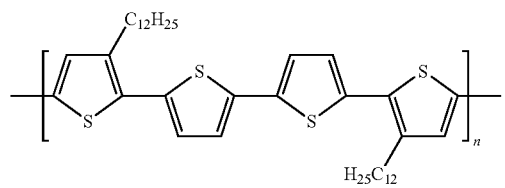

where n is a number of from about 5 to about 5,000. This polythiophene and its preparation are described in U.S. Pat. No. 6,770,904, the disclosure of which is totally incorporated herein by reference. The semiconductor polythiophene layer of about 30 nm to about 100 nm in thickness was deposited on top of the device by spin coating of the polythiophene in dichlorobenzene solution at a speed of 1,000 rpm for about 100 seconds, and dried in vacuo at 80° C. for 20 hr, followed by annealing in a vacuum oven at 120-140° C. for 10-30 min to induce high structural orders of the semiconductor. Subsequently, a series of source-drain electrode pairs were vacuum deposited on top of the semiconductor layer through a shadow mask, thus forming a set of thin film transistors of various dimensions. The resulting thin film transistor devices were evaluated using a Keithley 4200 thin film transistor characterization instrument. The device could be turned on at around zero voltage with a good current modulation of 300. Mobility was calculated to be 0.04 $cm^2$/N-sec. Because of the high dielectric constant of the dielectric layer, the thin film transistor could be operated at a relatively low voltage.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," include plural referents unless expressly and unequivocally limited to one referent. Thus, for example, reference to "a cellulose derivative" includes two or more different cellulose derivatives. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. A thin film transistor comprising:
a plastic substrate,
a gate electrode, a source electrode, a drain electrode, an organic semiconductor layer and a gate dielectric layer supported by the substrate and configured to form said thin film transistor, the gate dielectric layer comprising a cellulose derivative selected from the group consisting of cellulose acetate butyrate, cellulose acetate propionate, and cellulose acetate trimellitate.

2. The thin film transistor of claim 1, wherein the cellulose derivative has a dielectric constant greater than about 15.

3. The thin film transistor of claim 1, wherein the gate dielectric is positioned between the gate electrode and the organic semiconductor layer.

4. The transistor of claim 1, wherein the cellulose derivative is crosslinked with an additive.

5. The transistor of claim 4, wherein the additive is selected from the group consisting of a compound comprising at least two isocyanate groups, a compound comprising at least two epoxy groups, a compound comprising at least two carboxylic acid groups, and acid anhydrides of carboxylic acid.

6. The transistor of claim 1, wherein the gate dielectric layer has a dielectric constant greater than about 5.

7. A thin film transistor comprising a gate electrode, source and drain electrodes, semiconductor layer and a gate dielectric layer, wherein the gate dielectric is positioned between the gate electrode and the semiconductor layer, and further wherein the gate electrode is a doped silicon substrate and the gate dielectric layer comprises a cellulose derivative positioned on the silicon substrate, wherein the cellulose derivative is selected from the group consisting of cellulose acetate butyrate, cellulose acetate propionate, and cellulose acetate trimellitate.

8. The transistor of claim 7, wherein the dielectric layer has a thickness of from about 50 nm to about 2 µm.

9. The transistor of claim 7, wherein the dielectric layer has a thickness of from about 200 nm to about 1 µm.

10. The transistor of claim 9, wherein the dielectric layer has a dielectric constant greater than about 5.

11. The transistor of claim 10, wherein the dielectric layer has a dielectric constant greater than about 10.

12. The transistor of claim 7, wherein the dielectric layer has a dielectric constant greater than about 15.

13. The transistor of claim 7, wherein the transistor is operated at a gate bias voltage of less than about 20 V.

14. The transistor of claim 7, wherein the dielectric layer has a unit area capacitance greater than about 10 $nF/cm^2$.

15. The transistor of claim 7, wherein the dielectric layer has a unit area capacitance greater than about 20 $nF/cm^2$.

* * * * *

UNITED STATES PATENT AND TRADEMARK OFFICE
CERTIFICATE OF CORRECTION

PATENT NO.       : 7,619,242 B2
APPLICATION NO.  : 11/065149
DATED            : November 17, 2009
INVENTOR(S)      : Yiliang Wu et al.

It is certified that error appears in the above-identified patent and that said Letters Patent is hereby corrected as shown below:

In the Specification:

Column 1, line 7, after "Cooperative Agreement No.", please delete "70NANBOH3033" and insert --70NANB0H3033--.

Signed and Sealed this
Seventeenth Day of September, 2013

Teresa Stanek Rea
*Deputy Director of the United StatesPatent and Trademark Office*